US006795956B2

(12) United States Patent
Hokari

(10) Patent No.: US 6,795,956 B2
(45) Date of Patent: Sep. 21, 2004

(54) SEMICONDUCTOR DEVICE, AND METHOD AND PROGRAM FOR DESIGNING THE SAME

(75) Inventor: Toru Hokari, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/208,257

(22) Filed: Jul. 30, 2002

(65) Prior Publication Data

US 2003/0034562 A1 Feb. 20, 2003

(30) Foreign Application Priority Data

Jul. 31, 2001 (JP) ....................................... 2001-232400

(51) Int. Cl.[7] ................................................ G06F 17/50

(52) U.S. Cl. ................................ 716/10; 716/1; 716/8; 716/9

(58) Field of Search ...................... 716/10, 1–9, 11–21; 438/584, 623; 257/202, 207, 758

(56) References Cited

U.S. PATENT DOCUMENTS 6,171,946 B1 * 1/2001 Tsukamoto ................. 438/623
6,271,548 B1 * 8/2001 Umemoto et al. .......... 257/202
6,274,895 B1 * 8/2001 Fujii et al. .................. 257/207
6,300,229 B1 * 10/2001 Tanaka et al. .............. 438/584
6,525,350 B1 * 2/2003 Kinoshita et al. ........... 257/202
2001/0055219 A1 * 12/2001 Morihara et al. ........... 365/149
2003/0042611 A1 * 3/2003 Mori .......................... 257/758

FOREIGN PATENT DOCUMENTS

JP 04-144153 5/1992
JP 6-318685 11/1994

OTHER PUBLICATIONS

Japanese Examination Report, Japanese Application No. 2001–232400.

* cited by examiner

*Primary Examiner*—Vuthe Siek
*Assistant Examiner*—Magid Y. Dimyan
(74) *Attorney, Agent, or Firm*—Harness, Dickey & Pierce, P.L.C.

(57) ABSTRACT

A semiconductor device is designed by disposing a plurality of cells. The semiconductor device is equipped with a semiconductor substrate 1, transistors formed in the semiconductor substrate, a first wiring pattern 100 and a second wiring pattern 200 formed respectively in a first cell and a second cell disposed adjacent to each other in a X direction in a wiring layer disposed over the semiconductor substrate in layer, the first wiring pattern 100 and the second wiring pattern 200 having portions extending in parallel with each other in a Y direction perpendicular to the X direction, and an interlayer dielectric layer formed as a lower layer of the wiring layer, the interlayer dielectric layer having openings formed at locations corresponding to a position 11 or 12 of the first wiring pattern and a position 22 or 21 of the second wiring pattern, respectively.

13 Claims, 5 Drawing Sheets

SEMICONDUCTOR DEVICE, AND METHOD AND PROGRAM FOR DESIGNING THE SAME

BACKGROUND OF THE INVENTION

1. Technical Field of the Invention

The present invention generally relates to semiconductor devices, and more particularly, to semiconductor devices such as standard cells that include logic circuit sections that are designed using a variety of cells according to the customers' specifications. Furthermore, the present invention also relates to a method for designing such semiconductor devices and a design program.

2. Conventional Technology

Generally, in a semiconductor device, wiring patterns that are connected to transistors or the like formed within a semiconductor substrate are formed with metal wiring layers disposed in several layers over the semiconductor substrate through interlayer dielectric layers. To connect wiring patterns formed in the metal wiring layers to gate electrodes and impurity diffusion layers, or to connect wiring patterns formed in multiple layers to one another, openings (also called "through holes" or "via holes") are provided in the interlayer dielectric layers. Metal in an upper layer is filled in the opening of the interlayer dielectric layer to connect the upper layer to gate electrodes, impurity diffusion regions or metal wirings in a lower layer. The metal that fills the openings in the interlayer dielectric layer is called an input/output pin or a relay pin. Adjacent openings cannot be disposed too close to each other, and the pitch of the openings needs to be greater than the minimum pitch that is specified by the design rule.

Also, when a semiconductor device uses standard cells, the semiconductor device is designed while several kinds of cells that specify locations of transistors and wiring patterns included in predetermined circuit blocks are assembled on wiring grids. In this case, it may be easy to check the pitch of openings in each cell in advance. However, when cells are combined, it is difficult to check the pitch of openings without actually designing a layout, because many different combinations of such cells are possible.

Dispositions of openings in a semiconductor device will be described with reference to FIG. 5. In FIG. 5, grids shown by solid lines indicate wiring grids, and regions surrounded by broken lines indicate two adjacent cells disposed next to each other in an X direction.

In FIG. 5(*a*), an appropriate opening pitch that is specified by the design rule is set as a grid interval Dx in the X direction, and therefore an opening 51 and an opening 52 can be disposed next to each other in the X direction.

In FIG. 5(*b*), a grid interval Dx in the X direction is set to be narrower than the appropriate opening pitch that is specified by the design rule. However, since the opening 51 and the opening 52 are disposed shifted from each other in a Y direction, they still meet the conditions for an appropriate opening pitch.

In FIG. 5(*c*), a grid interval Dx in the X direction is set to be narrower than the appropriate opening pitch that is specified by the design rule. Also, since the opening 51 and the opening 52 are disposed adjacent to each other in the X direction, they cannot meet the conditions for an appropriate opening pitch.

For this reason, conventionally, grid intervals are set wider, or openings are not disposed in wiring grids adjacent to cell peripheral sections so as not to violate the design rule even when two cell openings are disposed adjacent to each other.

However, there have been demands for higher integration of semiconductor devices in recent years, and higher integration of semiconductor devices cannot be achieved by the conventional design algorithms such as the one described above.

In view of the problems described above, it is an object of the present invention to improve the wiring density by setting narrow grid intervals while satisfying the conditions for appropriate opening pitches specified by the design rule.

SUMMARY OF THE INVENTION

To solve the problems described above, a semiconductor device in accordance with the present invention has a layout designed by disposing a plurality of cells including a specified circuit block. The semiconductor device is equipped with: a semiconductor substrate; a plurality of transistors formed in the semiconductor substrate; a first wiring pattern and a second wiring pattern formed respectively in a first cell and a second cell adjacent to each other in a first direction in a wiring layer disposed over the semiconductor substrate, the first wiring pattern and the second wiring pattern having portions extending in parallel with each other in a second direction perpendicular to the first direction; and an interlayer dielectric layer formed as a lower layer of the wiring layer, the interlayer dielectric layer having openings formed at locations corresponding to a first position of the first wiring pattern and a second position of the second wiring pattern that is shifted from the first position in the first direction and the second direction.

Also, a method for designing a semiconductor device includes designing a layout by disposing a plurality of cells including a specified circuit block. The method includes: a step of disposing a plurality of transistors on wiring grids; a step of disposing a first wiring pattern and a second wiring pattern respectively in a first cell and a second cell adjacent to each other in a first direction of the wiring grids in a wiring layer disposed through an interlayer dielectric layer, and a step of disposing the first wiring pattern and the second wiring pattern to have portions extending in parallel with each other in a second direction of the wiring grids perpendicular to the first direction; and a step of forming openings in the interlayer dielectric layer at locations corresponding to a first position of the first wiring pattern and a second position of the second wiring pattern that is shifted from the first position in the first direction and the second direction.

Furthermore, a design program for designing a semiconductor device in accordance with the present invention includes designing a layout by disposing a plurality of cells including a specified circuit block. The design program for the semiconductor device causes a CPU to execute: a process of disposing a plurality of transistors on wiring grids; a process of disposing a first wiring pattern and a second wiring pattern respectively in a first cell and a second cell adjacent to each other in a first direction of the wiring grids in a wiring layer disposed through an interlayer dielectric layer, and a process of disposing the first wiring pattern and the second wiring pattern to have portions extending in parallel with each other in a second direction of the wiring grids perpendicular to the first direction; and a process of forming openings in the interlayer dielectric layer at locations corresponding to a first position of the first wiring pattern and a second position of the second wiring pattern that is shifted from the first position in the first direction and the second direction.

By the present invention thus structured, in the first cell and the second cell disposed adjacent to each other in the first direction, the first wiring pattern and the second wiring pattern are disposed to have portions extending in parallel with each other in the second direction perpendicular to the first direction, and openings in the interlayer dielectric layer are shifted in the second direction. As a result, the wiring density can be improved by setting narrow grid intervals while satisfying the conditions for appropriate opening pitches specified by the design rule.

DETAILED DESCRIPTION OF THE PREFERRED EMBODIMENTS OF THE PRESENT INVENTION

Embodiments of the present invention will be described with reference to the accompanying drawings.

Figure 1:
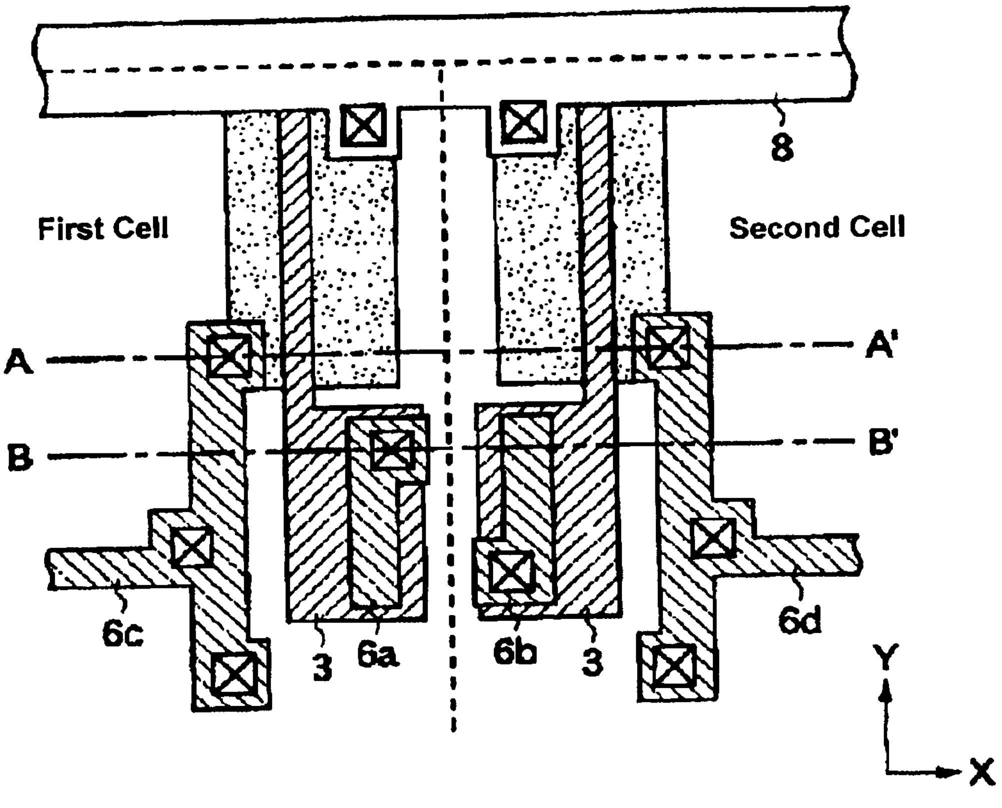
FIG. 1 shows a plan view in part of a layout of a semiconductor device in accordance with one embodiment of the present invention.
Figure 2:
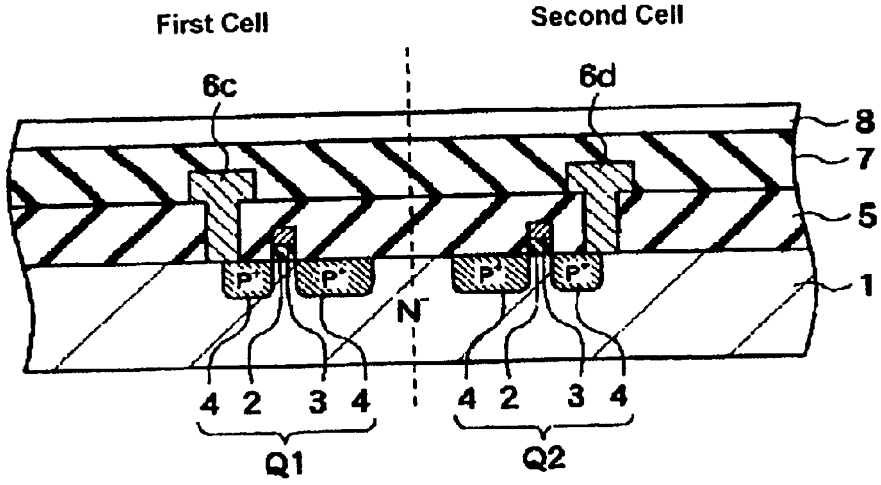
FIG. 2 shows a plan view in part of a layout of a semiconductor device in accordance with one embodiment of the present invention, wherein FIG. 2(*a*) shows a cross-sectional view taken along a line A–A' in FIG. 1, and FIG. 2(*b*) shows a cross-sectional view taken along a line B–B' in FIG. 1.
Figure 2:
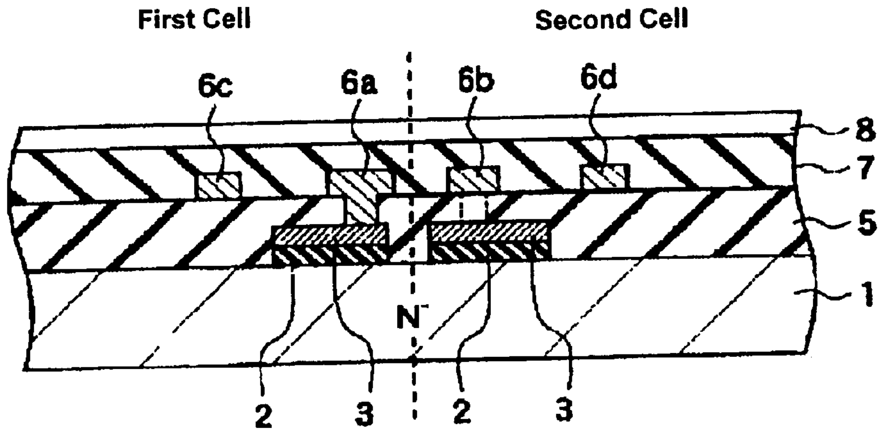

FIGS. 1 and 2 show part of a layout of a semiconductor device in accordance with one embodiment of the present invention. FIG. 1 shows a plan view thereof, FIG. 2(*a*) shows a cross-sectional view taken along a line A–A' in FIG. 1, and FIG. 2(*b*) shows a cross-sectional view taken along a line B–B' in FIG. 1. Note that an interlayer dielectric layer is omitted in FIG. 1.

As shown in FIGS. 1 and 2, gate electrodes 3 are formed over a semiconductor substrate 1 formed of, for example, silicon, through a gate dielectric layer 2. The gate dielectric layer 2 includes, for example, a silicon oxide layer or a silicon nitride layer. Also, the gate electrodes 3 may be formed, for example, by doping an impurity in polysilicon. Next, impurity diffusion layers 4 that become the source/drain are formed within the semiconductor substrate 1 on both sides of each of the gate electrodes 3. By this, as shown in FIG. 2(*a*), a transistor Q1 in a first cell and a transistor Q2 in a second cell are formed.

A first interlayer dielectric layer 5 is formed on the semiconductor substrate 1 where the transistors are formed, and openings are provided at predetermined locations in the first interlayer dielectric layer 5. Then, a first wiring layer is provided on the first interlayer dielectric layer 5, and designed wirings 6*a*–6*d* are patterned and formed by etching. Metal such as aluminum or the like is generally used as the wiring layer. Parts of the wiring layer in the first wiring layer are connected to the gate electrodes 3 and impurity diffusion layers 4 through the openings in the first interlayer dielectric layer 5.

Next, a second interlayer dielectric layer 7 is formed over the semiconductor substrate 1 where the first wiring layer is formed, and openings are provided in the second interlayer dielectric layer 7 at predetermined locations. Then, a second wiring layer 8 is provided on the second interlayer dielectric layer 7, and designed wirings are patterned and formed by etching. Parts of the wiring patterns in the second wiring layer 8 are connected to parts of the wiring patterns in the first wiring layer through the openings in the second interlayer dielectric layer 7.

As shown in FIGS. 1 and 2(*b*), in the first and second cells that are disposed adjacent to one another in the X direction, the wiring 6*a* and the wiring 6*b* are formed to have portions that extend in parallel with each other in the Y direction. In addition, in the first cell, the wiring 6*a* is connected to the gate electrode 3 through an opening in the first interlayer dielectric layer 5 at a position B–B' in FIG. 1. On the other hand, in the second cell, the wiring 6*b* is connected to the gate electrode 3 through an opening in the first interlayer dielectric layer 5 at a position shifted in the Y direction from the location B–B' in FIG. 1. In this manner, the wiring patterns are formed to have portions that extend in parallel with each other in the Y direction, and the positions of the openings are shifted from one another in the Y direction, such that the interval of the disposed wirings in the X direction can be set narrower than an appropriate opening pitch specified by the design rule.

The above description is made as to the forming positions of openings to be provided when the first wiring layers are connected to gate electrodes. However, the present invention is not limited to this structure, and is also applicable to any interlayer wirings. Also, the wiring layer may be a single wiring layer, two wiring layers, or multiple layers including three or more layers.

Figure 3:
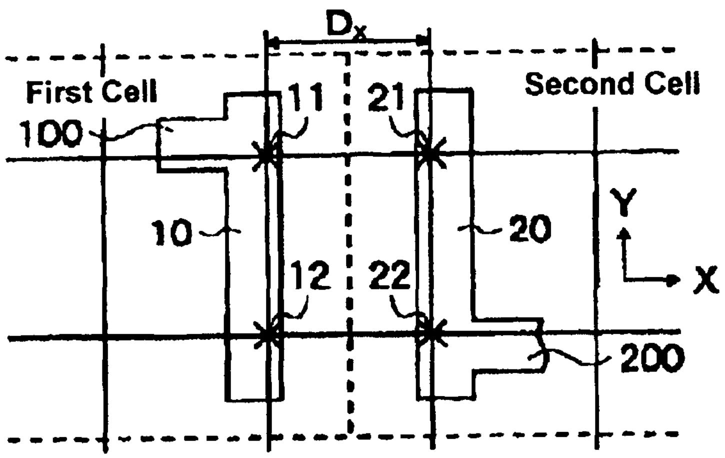
FIG. 3 schematically shows a layout of a semiconductor device in accordance with one embodiment of the present invention.
Figure 3:
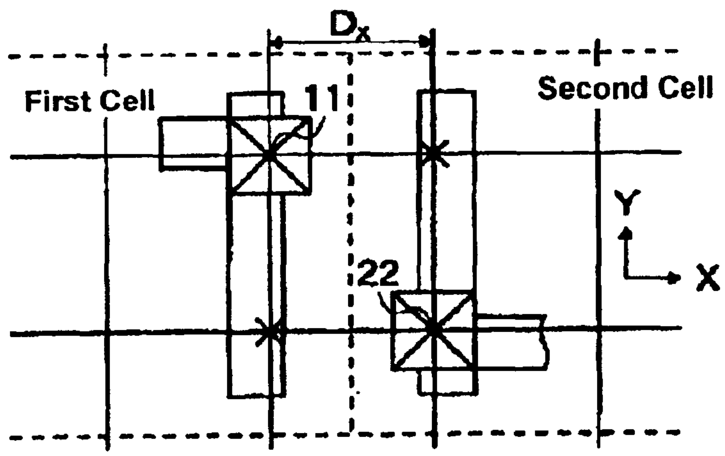
Figure 3:
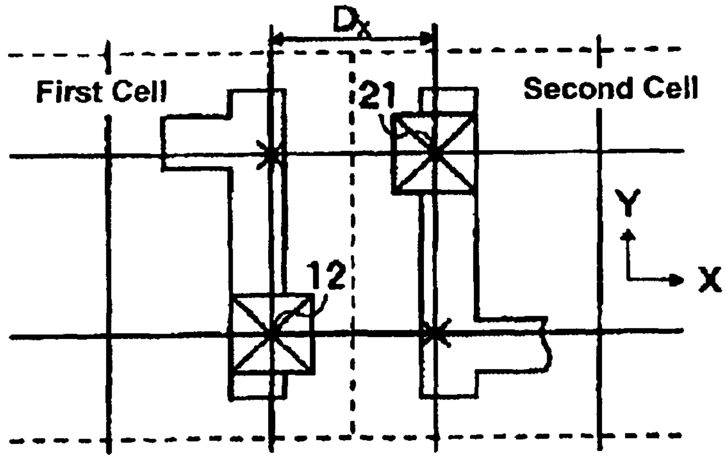

FIG. 3 schematically shows a layout of a semiconductor device in accordance with one embodiment of the present invention. In FIG. 3, grids shown by solid lines indicate wiring grids, and regions surrounded by broken lines indicate two adjacent cells disposed next to each other in an X direction. FIG. 3(*a*) shows only wiring patterns, FIG. 3(*b*) shows a positional relation between wiring patterns and openings in a first example, and FIG. 3(*c*) shows a positional relation between wiring patterns and openings in a second example.

As shown in FIG. 3(*a*), a wiring pattern 100 in a first cell and a wiring pattern 200 in a second cell have portions extending in parallel with each other in a Y direction along the wiring grids. Also, points 11 and 12 in the wiring pattern 100 define candidate points for providing openings in an interlayer dielectric layer.

In the present embodiment, a grid interval Dx in the X direction is set to be narrower than the minimum opening pitch specified by the design rule. Therefore, in the wiring patterns 100 and 200, openings cannot be provided at two points that are located adjacent to each other in the X direction and have the same Y-coordinate. However, by providing two candidate points in the wiring pattern 100, and two candidate points in the wiring pattern 200, one of the openings can be provided shifted with respect to the other, as shown in FIG. 3(*b*) or FIG. 3(*c*).

In FIG. 3(*b*), openings are provided in the interlayer dielectric layer at locations that correspond to the point 11 in the wiring pattern 100 and the point 22 in the wiring pattern 200. Also, in FIG. 3(*c*), openings are provided in the interlayer dielectric layer at locations that correspond to the point 12 in the wiring pattern 100 and the point 21 in the wiring pattern 200. In either case, the distance between the two openings is greater than the minimum opening pitch specified by the design rule.

Figure 4:
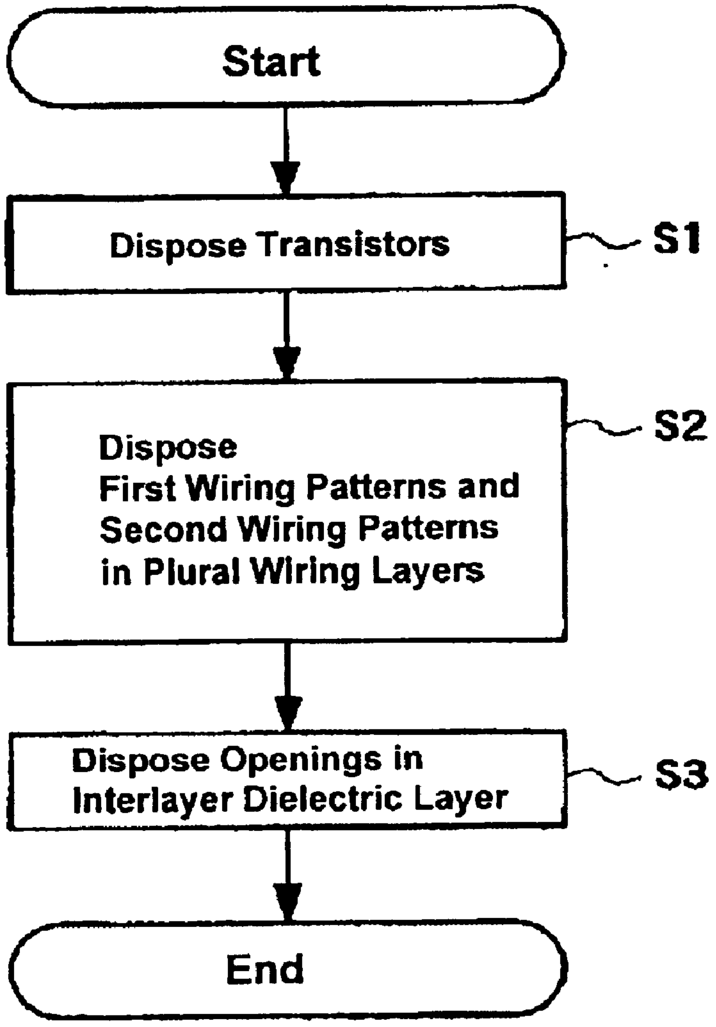
FIG. 4 shows a flowchart illustrating a method for designing a semiconductor device in accordance with one embodiment of the present invention.
Figure 5:
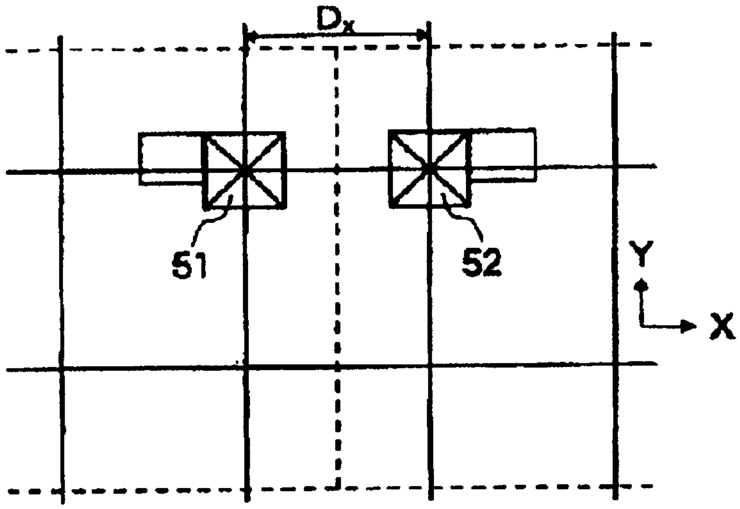
FIG. 5 is an illustration to describe dispositions of openings in a semiconductor device.
Figure 5:
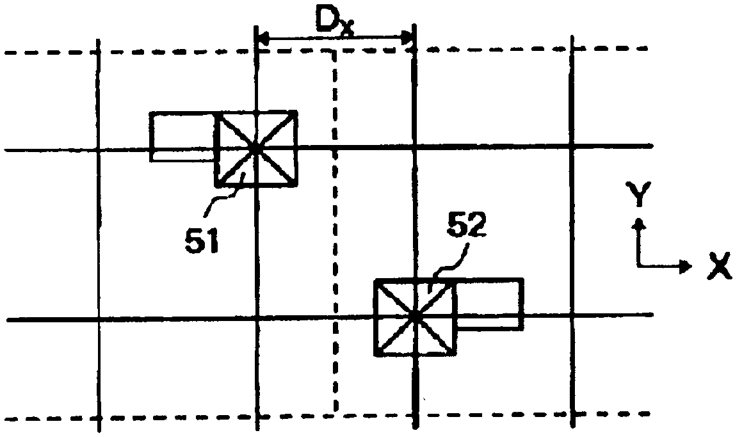
Figure 5:
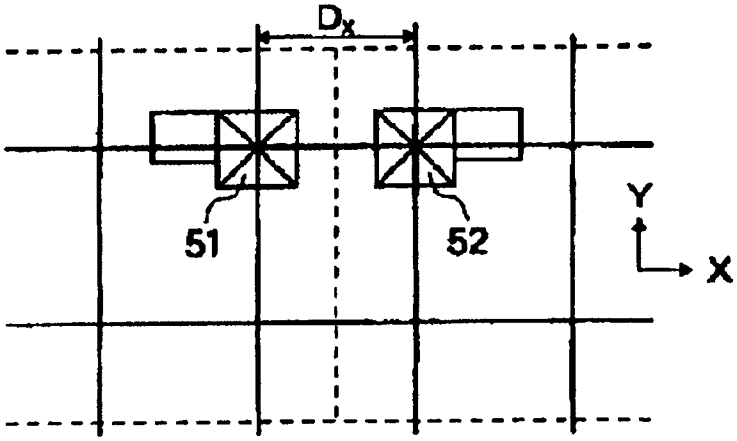

Next, a description will be made as to a method for designing the layout of the semiconductor device described above using a computer and software (design program). FIG. 4 shows a flowchart illustrating a method for designing a semiconductor device in accordance with one embodiment of the present invention. The design program is intended to dispose a plurality of cells including predetermined circuit blocks to thereby design a layout of a semiconductor device, and may be recorded and stored in a storage medium such as a flexible disk, hard disk, MO, MT, RAM, CD-ROM or DVD-ROM.

As shown in FIG. 4, first, in step 1, a plurality of transistors are disposed on wiring grids. Next, in step 2, in a wiring layer that is disposed in a layer through an interlayer dielectric layer, a first wiring pattern and a second wiring pattern are disposed in a first cell and a second cell, respectively, which are located adjacent to each other in a first direction of the wiring grids. Here, the first wiring pattern and the second wiring pattern are disposed in a manner to have portions that extend in parallel with each other in a second direction perpendicular to the first direction.

Next, in step 3, openings in the interlayer dielectric layer are disposed at locations corresponding to a first position in the first wiring pattern and a second position in the second wiring pattern, which is shifted form the first position in the first direction and the second direction of the wiring grids.

In this manner, dispositions of the wiring patterns and interlayer dielectric layer shown in FIG. 3(*b*) or FIG. 3(*c*) can be obtained.

As described above, in accordance with the present invention, the wiring density can be improved by setting narrower grid intervals while satisfying the conditions for appropriate opening pitches specified by the design rule. Also, verification of connections in the design of wiring dispositions does not need to be performed for every situation using virtual chips for verification, and only verification thereof within circuit blocks may be sufficient.

What is claimed is:

1. A semiconductor device comprising:

a semiconductor substrate;

a first wiring pattern and a second wiring pattern formed respectively in a first cell and a second cell adjacent to each other in a first direction in a wiring layer disposed over the semiconductor substrate, the first wiring pattern and the second wiring pattern having portions extending in parallel with each other in a second direction perpendicular to the first direction; and an interlayer dielectric layer formed as a lower layer of the wiring layer, the interlayer dielectric layer having a first opening formed at a location corresponding to a first position of the first wiring pattern in the first cell and a second opening formed at a location corresponding to a second position of the second wiring pattern in the second cell that is shifted from the first position in the first direction and the second direction.

2. The semiconductor device of claim 1 further comprising a plurality of transistors formed in the semiconductor substrate.

3. A method for designing a layout of a semiconductor device comprising:

a step of disposing a plurality of transistors on wiring grids;

a step of disposing a first wiring pattern and a second wiring pattern respectively in a first cell and a second cell adjacent to each other in a first direction of the wiring grids in a wiring layer disposed through an interlayer dielectric layer, and a step of disposing the first wiring pattern and the second wiring pattern to have portions extending in parallel with each other in a second direction of the wiring grids perpendicular to the first direction; and a step of forming a first opening in the interlayer dielectric layer at a location corresponding to a first position of the first wiring pattern in the first cell and forming a second opening at a location corresponding to a second position of the second wiring pattern that is shifted from the first position in the first direction and the second direction.

4. A design program for designing a layout of a semiconductor device in a CPU comprising:

a process of disposing a plurality of transistors on wiring grids;

a process of disposing a first wiring pattern and a second wiring pattern respectively in a first cell and a second cell adjacent to each other in a first direction of the wiring grids in a wiring layer disposed through an interlayer dielectric layer, and a process of disposing the first wiring pattern and the second wiring pattern to have portions extending in parallel with each other in a second direction of the wiring grids perpendicular to the first direction; and a process of forming a first opening in the interlayer dielectric layer at a location corresponding to a first position of the first wiring pattern in the first cell and forming a second opening at a location corresponding to a second position of the second wiring pattern in the second cell that is shifted from the first position in the first direction and the second direction.

5. A semiconductor device comprising:

a semiconductor substrate;

a first wiring pattern formed in a first wiring layer disposed over the substrate in a first cell;

a second wiring pattern formed in the first wiring layer adjacent to the first wiring pattern over the substrate in a second cell, the second wiring layer being spaced apart from the first wiring layer in a first direction, portions of the first wiring layer and second wiring layer extending parallel to one another in a second direction, the second direction being perpendicular to the first direction; and an interlayer dielectric layer disposed on the semiconductor substrate, the interlayer dielectric layer having a first opening formed at a location corresponding to a first position on the first wiring pattern in the first cell and a second opening formed at a location corresponding to a second position on the second wiring pattern in the second cell, the second position being shifted from the first position in the first direction and the second direction.

6. The semiconductor device of claim 5 wherein the interlayer dielectric layer is formed as a lower layer of the wiring layer.

7. The semiconductor device of claim 5 further comprising a plurality of transistors formed in the semiconductor substrate.

8. A semiconductor device comprising:

a semiconductor substrate;

an interlayer dielectric layer disposed on the semiconductor substrate, the interlayer dielectric layer having openings formed therein;

a first elongated wiring pattern disposed over the interlayer dielectric layer in a first cell; and a second elongated wiring pattern disposed over the interlayer dielectric layer spaced apart from and parallel to the first wiring pattern in a second cell;

wherein the openings are formed at locations corresponding to a first position on the first wiring pattern in the first cell and a second position on the second wiring pattern in the second cell, the second position being shifted from the first position in a first direction and a second direction perpendicular to the first direction.

9. The semiconductor device of claim 8 wherein the first wiring pattern and the second wiring pattern are formed in a wiring layer.

10. The semiconductor device of claim 9 wherein the interlayer dielectric layer is formed as a lower layer of the wiring layer.

11. The semiconductor device of claim 8 further comprising a plurality of transistors formed in the semiconductor substrate.

12. A semiconductor device comprising:

a semiconductor substrate;

a first wiring pattern and a second wiring pattern formed respectively in a first cell and a second cell adjacent to each other in a first direction in a wiring layer disposed over the semiconductor substrate, the first wiring pattern and the second wiring pattern having portions extending in parallel with each other in a second direction perpendicular to the first direction; and an interlayer dielectric layer formed as a lower layer of the wiring layer, the interlayer dielectric layer having a grid of candidate opening positions, and openings formed in the grid of candidate opening positions at locations corresponding to a first position of the first wiring pattern in the first cell and a second position of the second wiring pattern in the second cell that is shifted from the first position in the first direction and the second direction.

13. A method for designing a layout of a semiconductor device comprising:

a step of disposing a plurality of transistors on wiring grids;

a step of disposing a first wiring pattern and a second wiring pattern respectively in a first cell and a second cell adjacent to each other in a first direction of the wiring grids in a wiring layer disposed through an interlayer dielectric layer, and a step of disposing the first wiring pattern and the second wiring pattern to have portions extending in parallel with each other in a second direction of the wiring grids perpendicular to the first direction;

a step of forming a grid of candidate opening positions in the interlayer dielectric layer; and a step of forming openings in the interlayer dielectric layer at locations in the grid of candidate opening positions corresponding to a first position of the first wiring pattern in the first cell and a second position of the second wiring pattern in the second cell that is shifted from the first position in the first direction and the second direction.

* * * * *